United States Patent [15] 3,697,785
Gilbert [45] Oct. 10, 1972

[54] SOLID STATE SCANNING DEVICE

[72] Inventor: Barrie Gilbert, Portland, Oreg.

[73] Assignee: Tektronix, Inc., Park Beaverton, Oreg.

[22] Filed: Feb. 8, 1971

[21] Appl. No.: 113,632

Related U.S. Application Data

[63] Continuation of Ser. No. 737,237, June 14, 1968, abandoned, Continuation of Ser. No. 700,885, Jan. 26, 1968, Pat. No. 3,524,998.

[52] U.S. Cl. ..............................307/303, 317/235 R
[51] Int. Cl. ..............................H01l 19/04
[58] Field of Search ............317/235 Z, 235; 307/299

[56] References Cited

UNITED STATES PATENTS 3,284,677 11/1966 Haas..........................317/235
3,489,963 1/1970 Gilbert......................317/235

*Primary Examiner*—Jerry D. Craig
*Attorney*—Buckhorn, Blore, Klarquist & Sparkman

[57] ABSTRACT

A solid state scanning device comprises a planar or integrated circuit transistor having an elongated base disposed between an elongated emitter and an elongated collector. End terminals of the collector are connected to predetermined potential points, while an input is applied to end terminals of the base for bringing about sheet current distribution injection into the collector. As a result, a parabolic voltage distribution is produced along the collector. The current injection profile can be "tilted" by applying a finite difference in voltage to the base end terminals which will cause controlled movement of the collector voltage distribution for selection of plural output means or the like.

19 Claims, 12 Drawing Figures

BARRIE GILBERT
*INVENTOR*

*BY*

*BUCKHORN, BLORE, KLARQUIST & SPARKMAN*
*ATTORNEYS*

BARRIE GILBERT
*INVENTOR*

*BY*

*BUCKHORN, BLORE, KLARQUIST & SPARKMAN*
*ATTORNEYS*

SOLID STATE SCANNING DEVICE

CROSS REFERENCE TO RELATED APPLICATION

This application is a continuation of application Ser. No. 737,237 filed June 14, 1968, now abandoned.

The present application is related to my copending application Ser. No. 700,885 filed Jan. 26, 1968, now U.S. Pat. No. 3,524,998 entitled, RESISTIVE CONVERSION DEVICE, and assigned to the assignee of the present invention.

BACKGROUND OF THE INVENTION

In my above referred to application, a current steering device is described and claimed having considerable advantage in miniaturized switching application, anal-to-digital conversion, and the like. This device generally employs a resistive medium extending in at least two directions wherein input values applied thereto produce a voltage distribution along one edge. For example, in an illustrated embodiment, the resistive medium takes the shape of a "D" having a plurality of transistor bases coupled to the curved edge of the "D." The voltage distribution can be shifted to cause selective conduction in one transistor and provide a current, commonly coupled to all the transistors, to a particular selected output. This device is of considerable advantage in executing logical switching functions with a minimum of circuitry and equipment, but is characterized by a fairly low selectivity resulting from a comparatively gradually changing voltage distribution between transistors or other output devices.

SUMMARY OF THE INVENTION

According to the present invention, I have discovered an improved solid state scanning device including an elongated resistive medium and means for injecting a sheet of current into such medium. The sheet of current, suitably provided by control device means, produces a sharper substantially parabolic voltage distribution along the elongated resistive medium, which will be centrally located on the resistive medium so long as the sheet of current has a uniform distribution. The maximum or minimum of the parabolic distribution is quite pronounced or comparatively steep. If the current injection profile is "tilted," the physical position of the maximum or minimum moves accordingly, and can be made to transverse the entire effective length of the medium. Plural output devices such as transistors or the like may conveniently be individually operated by such maximum or minimum, with advantageous selectivity attributable to the parabolic spacial waveshape of the collector voltage distribution.

According to a preferred embodiment of the present invention the device takes the form of an integrated circuit transistor including an elongated collector electrode, an elongated emitter electrode, and an elongated base electrode therebetween. Spaced locations on the collector electrode are connected to potential points, e.g., they may both be grounded and an input is applied between spaced input coupling means on the base electrode. According to the voltage difference applied by the base input coupling means, the parabolic maximum or minimum may be moved along the collector electrode and used to selectively operate output means. This device is found to have reasonably high "transconductance" and is therefore usefully provided with a feedback circuit for obtaining a quite linear relation between input values and the position of the output.

It is accordingly an object of the present invention to provide an improved device for selecting physical position in accordance with electrical input values.

It is another object of the present invention to provide an improved solid state scanning device for delivering a sharper selection voltage distribution.

It is a further object of the present invention to provide an improved solid state scanning device having enhanced transconductance.

It is an additional object of the present invention to provide an improved solid state scanning device incorporating memory features.

It is still a further object of the present invention to provide an improved device for selecting a physical position in accordance with electrical input values wherein improved selectivity may be obtained between physical positions.

The subject matter which I regard as my invention is particularly pointed out and distinctly claimed in the concluding portion of this specification. The invention, however, both as to organization and method of operation, together with further advantages and objects thereof, may best be understood by reference to the following description taken in connection with the accompanying drawings wherein like reference characters refer to like elements.

DRAWINGS

DETAILED DESCRIPTION

Figure 1:
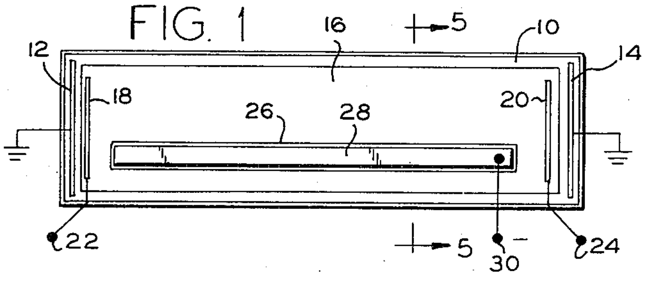
FIG. 1 is a plan view of a solid state scanning device according to the present invention.

Referring to the drawings, and particularly to FIG. 1, a solid state scanning device according to the present invention comprises an elongated resistive medium in the form of a collector electrode 10 having substantially uniform resistance and provided with end coupling means or contacts 12 and 14 suitably connected to fixed potential points, here grounded. Over the collector electrode is disposed a similarly elongated base electrode 16 supplied with end coupling means or contacts 18 and 20 connected respectively to input terminals 22 and 24. The base electrode 16 is suitably located longitudinally between the contacts 12 and 14. Above and longitudinally along one side of base electrode 16, and between contacts 18 and 20, is an emitter electrode 26 which is here metalized with an overlayer 28 connected to terminal 30.

Figure 5:
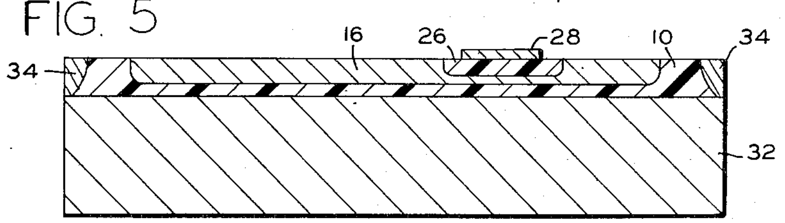
FIG. 5 is a cross section of the FIG. 1 device taken at 5—5 in FIG. 1.

The solid state device of FIG. 1 forms a transistor construction which may be either PNP or NPN form, with the latter being preferred for manufacturing reasons. FIG. 5 is a cross section of the FIG. 1 device wherein same elements are indicated with the same reference numerals. The device here includes a P-type substrate 32 supporting collector electrode 10 in the form of an N-type epitaxial layer. A P-type isolation diffusion 34 is here illustrated at the edge of the device. Base electrode 16 comprises a P-type base diffusion, and emitter electrode 26 comprises an N-type emitter diffusion having metal overlayer 28 contacting the same. The FIG. 5 cross section, as well as the FIG. 1 view, are illustrated in magnified proportion as compared with the actual device.

Figure 2:
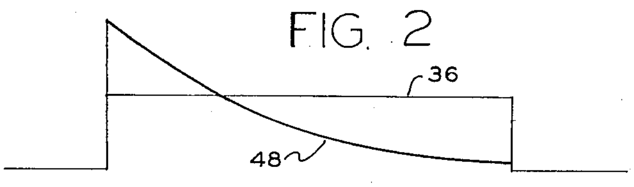
FIG. 2 is a profile of input current provided the FIG. 1 device.
Figure 3:
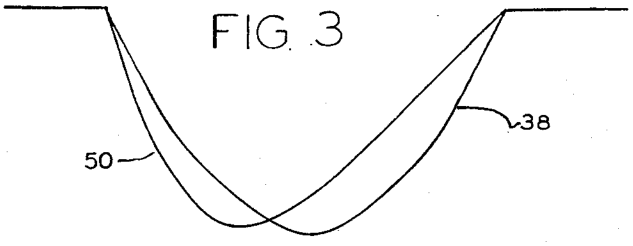
FIG. 3 is a profile of output voltage distribution along the output collector electrode of the FIG. 1 device.

When an appropriate current is connected to terminal 30, and a given negative voltage is applied to both terminals 22 and 24, base electrode 16 brings about injection of a substantially uniform sheet of current form emitter electrode 26 into collector electrode 10, having the distribution illustrated at 36 in FIG. 2. The collector has resistance therealong, and is connected to a fixed potential point at either end. The voltage distribution on the collector is found to be parabolic, as illustrated at 38 in FIG. 3, having a minimum midway along the collector.

Figure 4:
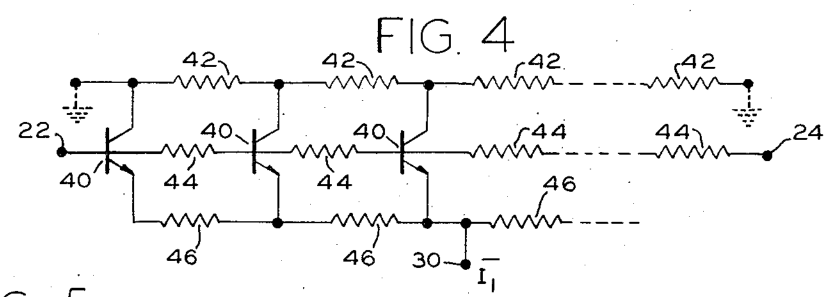
FIG. 4 is a schematic diagram of a simulated or equivalent circuit for the FIG. 1 device.

FIG. 4 illustrates an approximate equivalent circuit for the FIG. 1 device wherein transistors 40 are illustrative of the transistor action of the FIG. 1 device, and resistors 42 represent resistance along collector electrode 10. Similarly, resistors 44 illustrate the resistance distributed along the base electrode 16, while resistors 46 illustrate the resistance of the emitter electrode 26. Since emitter electrode 26 is here superposed with a metal layer 28, the value of resistors 46 will be substantially zero. If an identical input voltage is applied at terminals 22 and 24, each will conduct current to substantially the same extent, but different amounts of current will be seen to pass through the various resistors 42 toward the grounded end contacts of the collector. Some resistors 42, near the grounded terminals, carry more current than do resistors 42 close to the middle of collector electrode 10, and therefore the former drop more voltage than the latter. It will be seen that this physical configuration results in a voltage distribution curve having a minimum, such as the curve 38 in FIG. 3. In the instance of the device according to the present invention, this cure has been found to be substantially parabolic. The minimum is well defined and relatively sharp and is therefore easily able to select an output terminal or device.

Now, if the voltages at terminals 22 and 24 are changed so that a voltage difference exists therebetween, the current distribution supplied by emitter electrode 26 will become "tilted" as illustrated at 48 in FIG. 2. As a result, the voltage minimum will move to a location 50 in FIG. 3. As the voltage difference between terminals 22 and 24 is varied, the physical position of the minimum will move to the left or right and can be made to traverse substantially the entire length of collector electrode 10. This voltage movement can be used to operate transistor devices, e.g. having their base electrodes connected at spaced points along the collector electrode 10 and their emitters provided with a common d.c. current. The well defined voltage distribution readily selects a given transistor device and readily differentiates between devices. Each additional transistor device can be formed integrally with the device according to the present invention as will hereinafter be explained with reference to FIG. 6. The inputs provided at terminals 22 and 24 are desirably complementary, e.g., having the form of $xI$ and $(1-x)I$, wherein the factor $x$ can be considered as an input to the present device.

Figure 6:
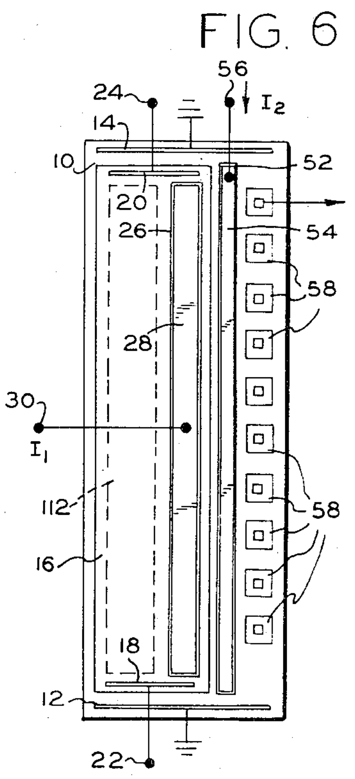
FIG. 6 is a plan view of a second embodiment of a solid state scanning device according to the present invention.

Referring to FIG. 6 wherein like reference numerals refer to like elements, an additional "emitter" electrode 52 is disposed over the same elongated collector electrode 10 and adjacent to the base electrode 16. "Emitter" electrode 52 is similarly contacted with a metal overlayer 54 connected to terminal 56 to which a current is supplied. Further, over the same collector electrode 10 are disposed a plurality of collector electrodes 58 for providing separate outputs for the FIG. 6 device. These collector electrodes are located in a row substantially lengthwise of the device so that the minimum of parabolic voltage distribution established in collector electrode 10 may be employed to select one of the collector electrodes 58.

Emitter electrode 52, together with collector electrode 10 and one of the collector electrodes 58 forms a lateral PNP transistor selected in its operation by the parabolic voltage distribution. Thus, collector electrode 10 forms the base for the lateral PNP transistor, and as the voltage along collector electrode 10 is sufficiently low to overcome the bias of one of the lateral PNP transistors, such PNP transistor will conduct supplying an output current at one of the collector electrodes 58 corresponding to the input current provided emitter electrode 52 at terminal 56. The emitter electrode 52 current is "steered" to one of the collector electrodes 58. The output devices are here formed as a part of the common semiconductive integrated circuit with the original device. The P-type isolation diffusion 34 has not been illustrated in the FIG. 6 diagram, nor in the succeeding views for simplicity of illustration.

Figures 7, 8, 9, 10, 11, 12:
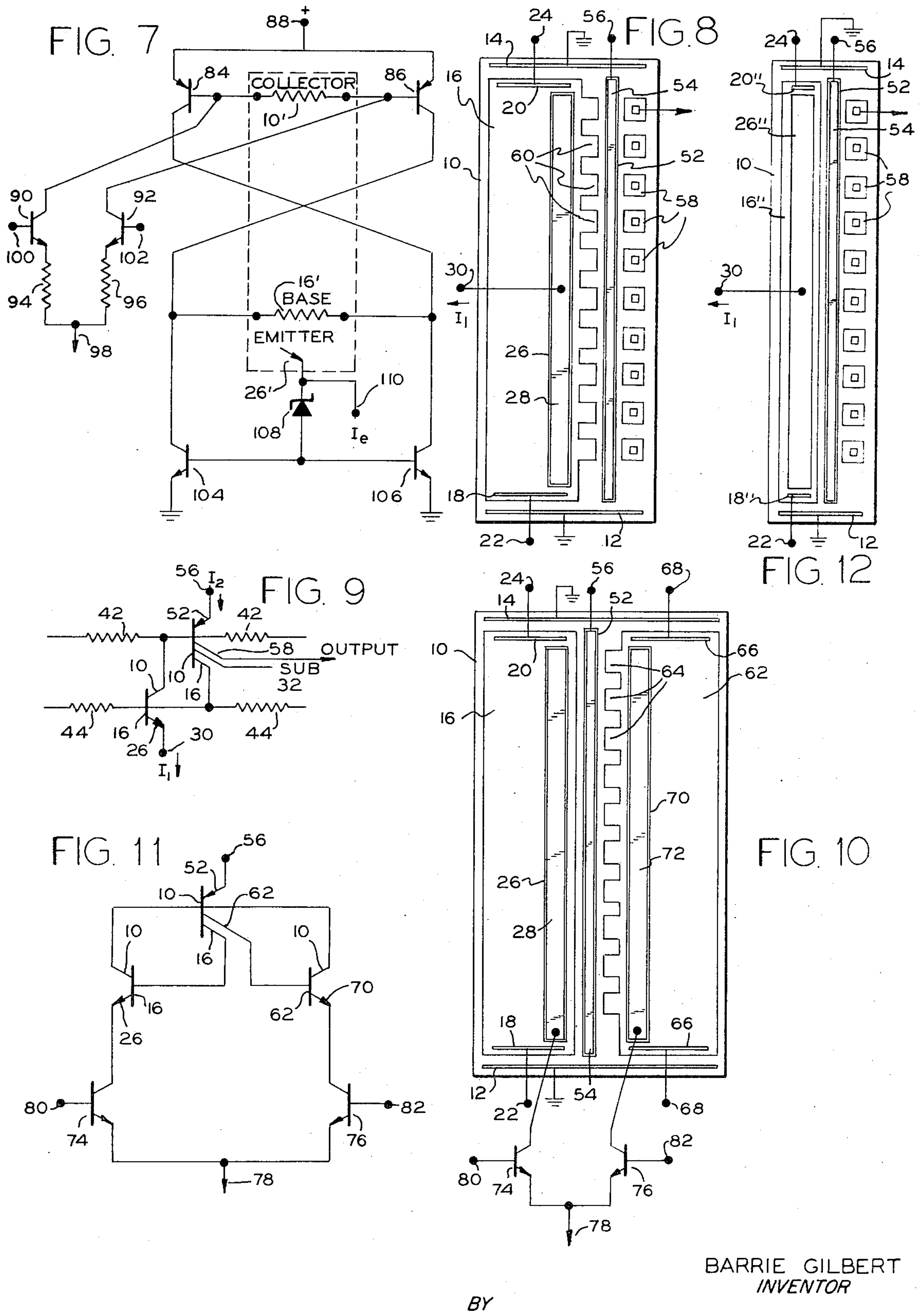
FIG. 7 is a schematic diagram of a negative feedback circuit for the FIG. 6 device.
FIG. 8 is a plan view of a solid state scanning device according to a third embodiment of the present invention.
FIG. 9 is a schematic diagram of an equivalent circuit for the FIG. 6 and FIG. 8 devices.
FIG. 10 is a plan view of a fourth embodiment of a solid state scanning device according to the present invention including circuitry for operating the same.
FIG. 11 is a schematic diagram of an equivalent circuit for the FIG. 10 device.
FIG. 12 is a plan view of yet another embodiment of a solid state scanning device according to the present invention.

In addition, the device of FIG. 6 has positive feedback properties for effectively enhancing or sharpening the original parabolic voltage distribution established on collector electrode 10. Not only is a PNP transistor formed by emitter elector 52, collector electrode 10, and collector electrode 58 in that order, but also a lateral PNP transistor is formed by emitter electrode 52, collector electrode 10, and base electrode 16. An approximate equivalent circuit wherein similar elements are referred to by the same reference numerals is illustrated in FIG. 9, it being observed that electrodes 10 and 16 are common to both the equivalent transistors depicted in FIG. 9. As a result of the feedback via electrode 16, improved switching of an output from one collector electrode 58 to another can take place, as the input between terminals 22 and 24 is differentially changed.

Moreover, if it is desired to hold or store the selection of a particular collector electrode 58, the somewhat similar configuration of FIG. 8 is employed. The PNP emitter current $I_2$to emitter 52 in the FIG. 8 device is raised to a sufficient regeneration level for causing the feedback to be intensified to an extent that the input applied between terminals 22 and 24 is no longer able to control the output selected. The input may then swing through a scanning waveform or the like while a collector electrode 58 operative at the time $I_2$is raised will continue to provide an output, the only proviso being that the voltage change caused by the input excursion between terminals 22 and 24 is less than the voltage generated by the feedback current as it flows in the resistance of layer 16. The latter condition is more easily met by employing peninsulas or protrusions 60 on the side of the base electrode 16 adjacent emitter electrode 52 as shown in FIG. 8. These peninsulas or protrusions 60 lead to a "cogwheel" type of appearance wherein the resistance of region 16 has thus been deliberately raised so that less PNP collector current is needed to insure latching of the device to a particular output collector electrode 58. It is noted that each of the protrusions 60 is aligned with, and at substantially the same longitudinal position (along the device) as a collector electrode 58. When it is desired to discontinue storing, the current $I_2$delivered at terminal 56 may once more be reduced to its original operating level.

A second storage type of device is illustrated in FIG. 10 where again the same reference numerals are used to refer to elements hereinbefore discussed. In the FIG. 10 embodiment, the base electrode 16 is without protrusions, but instead of employing output collector electrodes 58, a second elongated base electrode 62 is located on the opposite side of the emitter electrode form base electrode 16, and base electrode 16, and base electrode 62 is formed with a plurality of protrusions 64 extending towards base 16 at substantially the same locations as hereinbefore described in connection with collector electrodes 58 of the FIG. 8 device. Base electrode 62, which is here P-type, is provided with end connections 66 respectively coupled to terminals 68, and an N type emitter electrode 70 is disposed lengthwise over base electrode 62 between connections 66. Emitter electrode 70 is adjacent protrusions 64, and is suitably contacted with a metalized overlayer 72.

The FIG. 10 device is operated by a current steering circuit comprising NPN transistors 74 and 76 having their emitter electrodes connected to a common current terminal 78 and having their collector electrodes connected respectively to emitter electrode 26 and emitter electrode 70. A differential input is supplied at terminals 80 and 82 connected respectively to the base electrodes of transistors 74 and 76.

Assume a constantly changing voltage waveform, e.g. a sine wave form, is applied differentially between terminals 22 and 24. Also assume that initially a higher voltage is applied at terminal 80 and a lower voltage is applied at terminal 82 so that appropriate operating current is supplied emitter electrode 26. The PNP "collectors" formed by protrusions 64 will be s elected one after the other in the same manner as the collector electrodes 58 in the embodiment of FIG. 6. When a desired point in the waveform is reached, the value of which is to be stored, the voltage at terminal 80 is lowered, and the voltage at terminal 82 is raised, now delivering appreciable operating current to emitter 70. One of the protrusions 64, the one to which current was delivered when the current was switched from terminal 80 to terminal 82, will now be effective to gate current injected from emitter electrode 70 into collector electrode 10. The latter condition will be maintained as long as the circuit comprising transistors 74 and 76 is in its last described condition. If scanning is to be resumed, the voltage at terminal 80 is raised, and the voltage at terminal 82 is lowered.

FIG. 11 is a partially equivalent circuit for the device of FIG. 10 and also includes transistors 74 and 76. It is seen that electrodes 70, 62, and 10 comprise an NPN transistor which takes over from the NPN transistor comprising electrodes 26, 16, and 10 when the circuit comprising transistors 74 and 76 switches. Moreover, feedback is also inherent in the operation of this circuit through base layers 16 and 62, contributing to the advantages of the device in sharp output selection and storage. The FIG. 10 device provides an analog readout differentially between terminals. 68.

FIG. 7 illustrates a circuit for linearizing the operation of the device according to the present invention so that the position of the parabolic maximum or minimum produced in the device's collector electrode (and therefore the output selected) is a linear function of input. Feedback can be employed since the device according to the present invention is found to have reasonably high "transconductance." Elements 10', 16', and 26' correspond to similar but unprimed elements in the FIG. 1 device. The end terminals of collector electrode 10' are coupled to the base terminals of collector electrode 10' are coupled to the base terminals of transistors 84 and 86, respectively, the emitters of which are connected in common to a positive terminal 88. The collectors of transistors 84 and 86 are cross-connected to the end terminals of base electrode 16', and also to the collectors of bias transistors 104 and 106, the emitters of which are grounded. A zener diode 108 couples the commonly connected bases of transistors 104 and 106 to emitter 26', emitter 26' also being connected to terminal 110 for providing emitter current $I_e$.

An input circuit comprises transistors 90 and 92 having their emitters connected to a negative terminal 98 through balancing resistors 94 and 96, respectively. The bases of transistors 90 and 92 are connected to input terminals 100 and 102, while their collectors are here coupled to the base terminals of transistors 84 and 86.

AS will be seen, an imbalance across base 16' as a result of an input between terminals 100 and 102 will produce not only a desired voltage distribution along collector electrode 10', but will also produce an imbalance in the current flowing at the end terminals thereof. As a result of the cross-connected negative feedback from the collectors of transistors 84 and 86, the balance of current applied at the end terminals of base electrode 16' tends to be more nearly maintained. Of course, some imbalance still takes place in the currents delivered to base 16', as must be the case if there is to be any circuit input. However, the negative feedback linearizes and reduces the effect of a given input differential between terminals 100 and 102. As a result, the position of a voltage maximum or minimum along collector electrode 10' is rendered a substantially linear function of the input differential between terminals 100 and 102.

The circuit including transistors 104, 106, and zener diode 108 is employed for obtaining the proper bias differential between emitter 26' and the base 16', zener diode 108 supplying the requisite voltage drop, and transistors 104 and 106 being effective to supply a given quiescent base bias level at the end terminals of base 16'. The differential input between terminals 100 and 102 is here applied via the differential amplifier comprising transistors 90 and 92 to the base terminals of transistors 84 and 86. It is understood that the differential input is thus applied through transistors 84 and 86 to base electrode 16', the latter comprising the input electrode for the device according to the present invention. The input differential may be supplied more directly to the base electrode 16' if so desired. Transistors 84, 86, 90, and 92 may suitably be fabricated in integrated circuit fashion with the transistor comprising elements 10', 16', and 26'.

Returning to the embodiment of FIG. 6, it will be noted that base electrode 16 is illustrated as being wider than emitter electrode 6, with emitter 26 located along the right hand edge of base electrode 16 in the figure for maximum control with respect to base electrodes 58. The purpose of the greater width of base electrode 16 is to reduce the resistivity of the base electrode 16 whereby the current distribution illustrated at 36 in FIG. 2, for example, will be relatively flat and will not dip appreciably towards the center of the base electrode. Another means of reducing such resistivity is the placement of a low resistivity diffusion 112, illustrated in dashed lines in FIG. 6, on top of base electrode 16.

Alternatively, the configuration illustrated in FIG. 12 may be employed utilizing a narrower base electrode 16'' wherein this electrode is not much wider than emitter electrode 26''. The device of FIG. 12 is otherwise substantially similar to the device of FIG. 6. In this embodiment the resistance per unit length in base electrode 16'' is beta times the resistance per unit length in emitter 26'', and no metalized overlayer is employed on top of emitter electrode 26''. Rather, a connection is suitably made to the center of emitter electrode 26'' and brought out to terminal 30. In this discussion, beta is the common emitter, forward current transfer ratio for the device. Again, this configuration provides a relatively flat current injection distribution which, of course, may be "tilted" by a differential input applied between terminals 22 and 24.

In all the above devices, the resistivity of the collector electrode should be substantially uniform for providing a well-defined voltage distribution wherein the location of a maximum or minimum corresponding to a given input differential is predictable. While in the above illustrations a voltage distribution minimum along the collector electrode is generally described, it is understood the minimum is generated because of the utilization of a basic NPN transistor configuration, in the device of FIG. 1, for example. In the instance of a PNP device, a maximum rather than a minimum would result. It is understood that the present invention is not specifically restricted to either a maximum or minimum in the voltage distribution because either can be employed to select an output terminal or output device.

While I have shown and described preferred embodiments of my invention, it will be apparent to those skilled in the art that many changes and modifications may be made without departing from my invention in its broader aspects. I therefore intend the appended claims to cover all such changes and modifications as fall within the true spirit and scope of my invention.

I claim:

1. A device for selecting a physical position is accordance with electrical input values comprising:

an elongated, continuous, resistive medium;

plural spaced coupling means for connecting said resistive medium to a pair of predetermined potential points;

means having a given polarity for injecting a controllable sheet of current longitudinally along said resistive medium and including means for providing a variable maximum current value at one end of said sheet and a variable minimum at the other end thereof with intermediate values therebetween to produce a voltage distribution in said resistive medium having a maximum or minimum value located between the ends of said sheet of current along said sheet of current brought about by the profile of said controllable sheet of current and the resistance of said medium between said coupling means;

said pair of predetermined potential points each having a potential level different from and of the same relative polarity with respect to said means for injecting current;

and output means along said resistive medium which are separate from said spaced coupling means and includes a junction said output means being selectively operable by said maximum or minimum of said voltage distribution exceeding an input threshold thereof for steering a current in said output means.

2. The device according to claim 1 wherein said output means comprise transistor means.

3. The device according to claim 1 wherein said resistive medium comprises a semiconductor collector electrode, and wherein said means for injecting current comprises an emitter electrode and base electrode disposed in operative relation with said collector electrode to provide transistor action therewith.

4. A device for selecting a physical position in accordance with electrical input values comprising:

an elongated resistive medium, plural spaced coupling means provided for said resistive medium for connection to predetermined potential points, means for injecting a controllable sheet of current longitudinally along said resistive medium for producing a voltage distribution in said resistive medium having a maximum or minimum value located between the ends of said sheet of current and positionable according to the distribution of current along said sheet of current, said controllable sheet of current having a variable maximum current value at one end thereof and a variable minimum current value at the other end thereof with intermediate values therebetween, and negative feedback means between said coupling means for said resistive medium and said means for injecting a sheet of current, for producing linear movement of said voltage distribution with change in input current distribution.

5. A device for selecting a physical position in accordance with electrical input values comprising:

an elongated, continuous, resistive medium provided with plural coupling means spaced therealong connected to predetermined potential points, control device means for injecting a controllable sheet of current longitudinally along said resistive medium, said injected current producing a substantially parabolic voltage distribution along said resistive medium, plural output means disposed along said resistive medium selectively operable by said parabolic distribution exceeding the operating threshold thereof, and positive feedback provided between said output means and said means for injecting current to sharpen the profile of said parabolic voltage distribution.

6. A semiconductor device comprising:

an elongated, continuous collector electrode having a pair of coupling means spaced therealong for connection to predetermined potential points, an elongated base electrode disposed in superposed relation with the collector electrode and also provided with a pair of coupling means spaced therealong, an elongated emitter electrode disposed along and in superposed relation with said base electrode, said emitter electrode being provided with means for connection to a source of current for said emitter electrode, means for providing electrical input values to said coupling means of said base electrode causing said base electrode to bring about injection of a sheet of current from said emitter electrode into said collector electrode, said sheet of current having a distribution varying from a maximum proximate one of said coupling means of said base electrode to a minimum proximate the other of the coupling means of said base electrode when input values applied to the coupling means of said base electrode are unequal, said sheet of current producing a substantially parabolic voltage distribution along said collector electrode due to the resistance of said collector electrode between said pair of coupling means thereof, said parabolic voltage distribution having a maximum or minimum shiftable in accordance with the input values applied to said coupling means of said base electrode, and output means along said collector electrode, said output means including a junction and being selectively operable by said maximum or minimum of said voltage distribution exceeding an input threshold thereof.

7. The device according to claim 6 wherein the resistivity of said collector electrode is substantially uniform.

8. The device according to claim 6 wherein said output means comprise transistor means for steering a common supply current with said maximum or minimum of said voltage distribution.

9. The device according to claim 6 wherein said emitter electrode is metalized.

10. The device according to claim 6 wherein said means for connection to a source of current is disposed centrally of said emitter electrode, the resistance per unit length of the base electrode being beta times the resistance per unit length of the emitter electrode, wherein beta is the common-emitter forward current transfer ratio of said semi-conductor device.

11. A semiconductor device comprising:

an elongated collector electrode having a pair of coupling means spaced therealong for connection to predetermined potential points, an elongated base electrode disposed in superposed relation with the collector electrode and also provided with a pair of coupling means spaced therealong, an elongated emitter electrode disposed along and in superposed relation with said base electrode, said emitter electrode being provided with means for connection to a source of current for said emitter electrode, means for providing electrical input values to said coupling means of said base electrode causing said base electrode to bring about injection of a sheet of current from said emitter electrode into said collector electrode, said sheet of current having a distribution varying from a maximum proximate one of said coupling means of said base electrode to a minimum proximate the other of the coupling means of said base electrode when input values applied to the coupling means of said base electrode are unequal, said sheet of current producing a substantially parabolic voltage distribution along said collector electrode having a maximum or minimum shiftable in accordance with the input values applied to said coupling means of said base electrode, and feedback circuit means cross coupling the coupling means for the collector electrode in negative driving relation to the coupling means for said base electrode, for linearizing the control of the collector voltage distribution by input values.

12. The device according to claim 11 wherein said feedback circuit means includes a pair of transistors for cross coupling said coupling means of the base and collector electrodes.

13. A semiconductor device comprising:

an elongated collector electrode having a pair of coupling means spaced therealong for connection to predetermined potential points, an elongated base electrode disposed in superposed relation with the collector electrode and also provided with a pair of coupling means spaced therealong, an elongated emitter electrode disposed along and in superposed relation with said base electrode, said emitter electrode being provided with means for connection to a source of current for said emitter electrode, means for providing electrical input values to said coupling means of said base electrode causing said base electrode to bring about injection of a sheet of current from said emitter electrode into said collector electrode, said sheet of current having a distribution varying from a maximum proximate one of said coupling means of said base electrode to a minimum proximate the other of the coupling means of said base electrode when input values applied to the coupling means of said base electrode are unequal, said sheet of current producing a substantially parabolic voltage distribution along said collector electrode having a maximum or minimum shiftable in accordance with the input values applied to said coupling means of said base electrode, said base electrode being located longitudinally between the coupling means for said collector electrode, and output means along said collector electrode, said output means including a junction and being selectively operable by said maximum or minimum of said voltage distribution exceeding an input threshold thereof.

14. A semiconductor device comprising:

an elongated collector electrode having a pair of coupling means spaced therealong for connection to predetermined potential points, an elongated base electrode disposed in superposed relation with the collector electrode and also provided with a pair of coupling means spaced therealong, an elongated emitter electrode disposed along and in superposed relation with said base electrode, said emitter electrode being provided with means for connection to a source of current for said emitter electrode, means for providing electrical input values to said coupling means of said base electrode causing said base electrode to bring about injection of a sheet of current from said emitter electrode into said collector electrode, said sheet of current having a distribution varying from a maximum proximate one of said coupling means of said base electrode to a minimum proximate the other of the coupling means of said base electrode when input values applied to the coupling means of said base electrode are unequal, said sheet of current producing a substantially parabolic voltage distribution along said collector electrode having a maximum or minimum shiftable in accordance with the input values applied to said coupling means of said base electrode, and second transistor means forming a common semiconductive integrated circuit with said device, said second transistor means being disposed along said base electrode and including said collector electrode, wherein said parabolic voltage distribution is effective to initiate a preselected physically located output from said second transistor means.

15. The device according to claim 14 wherein the second transistor means includes an elongated second emitter electrode disposed along said base electrode and over said collector electrode, and a plurality of selectable collector electrodes disposed along said second emitter electrode and over said collector electrode.

16. The device according to claim 15 wherein said base electrode is provided with a plurality of protrusions extending toward said second emitter electrode individually in substantial alignment with said second collector electrodes for providing preferential selection of second collector electrodes.

17. The device according to claim 14 wherein said second transistor means includes a second base electrode disposed along said first mentioned base electrode over the same collector electrode and having a plurality of protrusions extending toward said first mentioned base electrode, the said second base electrode having a pair of coupling means spaced therealong, a second emitter electrode positioned over said collector electrode between the first and second base electrodes, and a third elongated emitter electrode disposed over said second base electrode.

18. The device according to claim 17 further including circuit means for switching current between the first mentioned emitter electrode and the third emitter electrode.

19. The device according to claim 14 with said second transistor means being disposed in coupling relation to said base electrode to provide a feedback circuit therewith.

* * * * *

UNITED STATES PATENT OFFICE
CERTIFICATE OF CORRECTION

Patent No. 3,697,785 Dated October 10, 1972

Inventor(s) Barrie Gilbert

It is certified that error appears in the above-identified patent and that said Letters Patent are hereby corrected as shown below:

Column 8, line 44, "includes" should be --include--.

Signed and sealed this 20th day of November 1973.

(SEAL)
Attest:

EDWARD M.FLETCHER,JR.
Attesting Officer

RENE D. TEGTMEYER
Acting Commissioner of Patents